United States Patent [19]

Kiku

[11] Patent Number: 5,031,076
[45] Date of Patent: Jul. 9, 1991

[54] MULTIFUNCTIONAL CARD HAVING A STATIC PROTECTION

[75] Inventor: Yutaro Kiku, Yokohama, Japan

[73] Assignee: E. I. Du Pont de Nemours and Company, Wilmington, Del.

[21] Appl. No.: 446,337

[22] Filed: Dec. 5, 1989

[30] Foreign Application Priority Data

Dec. 6, 1988 [JP] Japan .......................... 63-158035[U]

[51] Int. Cl.⁵ ............................................... H05K 9/00
[52] U.S. Cl. .................. 361/424; 174/35 R; 361/391; 361/394; 361/397; 361/399
[58] Field of Search ............ 361/212, 220, 395, 216, 361/395, 399, 380, 424, 390, 391, 392, 394, 397; 174/51, 35 R; 364/200, 222, 400; 439/92, 108, 181, 186, 94, 101, 109

[56] References Cited

U.S. PATENT DOCUMENTS

| | | | |
|---|---|---|---|
| 3,603,845 | 9/1971 | Beers | 361/395 |
| 4,300,016 | 11/1981 | Bergeron et al. | 174/35 R |
| 4,667,266 | 5/1987 | Masuoka et al. | 361/212 |
| 4,858,070 | 8/1989 | Buron et al. | 361/395 |
| 4,872,091 | 10/1989 | Mamiwa et al. | 361/424 |

Primary Examiner—Leo P. Picard
Assistant Examiner—Donald A. Sparks

[57] ABSTRACT

A multifunctional card comprising a substrate having a semiconductor circuit, and a housing, made of an insulating material, for housing the substrate, wherein the housing comprises two pieces of housing halves to be fitted to contain the substrate therein, and a conductive member is arranged in the housing along a seam between the housing halves so as to surround the substrate and to be electrically connected to a ground portion of the substrate.

4 Claims, 2 Drawing Sheets

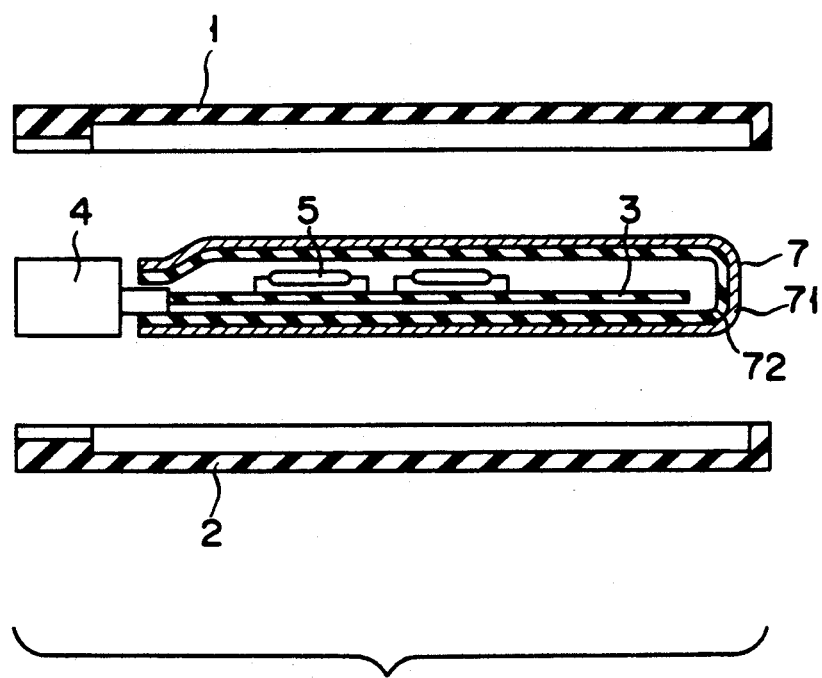
F I G. 2

MULTIFUNCTIONAL CARD HAVING A STATIC PROTECTION

BACKGROUND OF THE INVENTION

The present invention relates to a multifunctional card having a static protection means.

2. Description of the Related Art

In a conventional multifunctional card, such as a memory cassette, semiconductor circuits mounted into the cassette are damaged by electrostatic. For protecting the card from the adverse effects of static, a metal cover or housing of a multifunctional card is generally grounded. However, a housing made of a plastic material is often used in a consideration of a cost or a request from a customer. In a multifunctional card using a plastic housing, the static generated from a human body is discharged onto a substrate through a mating portion of the housing, so that destruction of elements, such as ICs, may occur.

According to conventional techniques, when a housing is to be made of a plastic material, in order to prevent the static caused destruction, a structure allowing a great creeping distance is generally employed, or complete insulation is performed (by an adhesive agent, sealing, ultrasonic welding, or the like). In the former technique, a complicated structure is required to perform completely static protection and hence problems are posed in terms of reliability, cost, and the like. In the latter technique, manufacturing processes become complicated, and a problem is posed when the housing is posed afterward.

SUMMARY OF THE INVENTION

It is an object of the present invention to provide a multifunctional card which provide effective static protection and can be easily manufactured at a low cost.

In order to achieve the above objects, there is provided a multifunctional card comprising a substrate having a semiconductor circuit, and a housing made of an insulating material, for housing the substrate, wherein the housing comprises first and second housing halves constituting upper and lower portions of the housing, and a conductive member is arranged in the housing along a seam between the first and second housing halves so as to surround the substrate and to be electrically connected to a ground portion of the substrate.

According to the multifunctional card of the invention, once the multifunctional card has been removed from a main apparatus, and static discharge occurs through the mating portion between the first and second housing halves of the housing, the static is discharged onto the conductive member. In this case, only the conductive member is charged, and hence the charge does not reach the internal IC. The charge in this member is subjected to natural discharge. While the multifunctional card is being pulled from the main apparatus, the static generated from a human body and the like is discharged onto the conductive member. In this case, since the ground portion in the multifunctional card is connected to the ground portion of the main apparatus, the static is discharged onto the ground portion, thus preventing the static related destruction.

As described above, the present invention comprises the conductive member for preventing the static discharge through the mating portion or seam of the housing so that even in a multifunctional card comprising a housing made of an insulating material, destruction of circuit element due to external electrostatic discharge can be prevented. Furthermore, the conductive member of the present invention is simple in structure and easy to attach to a conventional card, so that the multifunctional card of the invention can be easily manufactured at a low cost.

BRIEF DESCRIPTION OF THE DRAWINGS

FIG. 2 is a partially exploded perspective view showing the assembled multifunctional card of the embodiment.

DETAILED DESCRIPTION OF THE PREFERRED EMBODIMENTS

Figure 1:
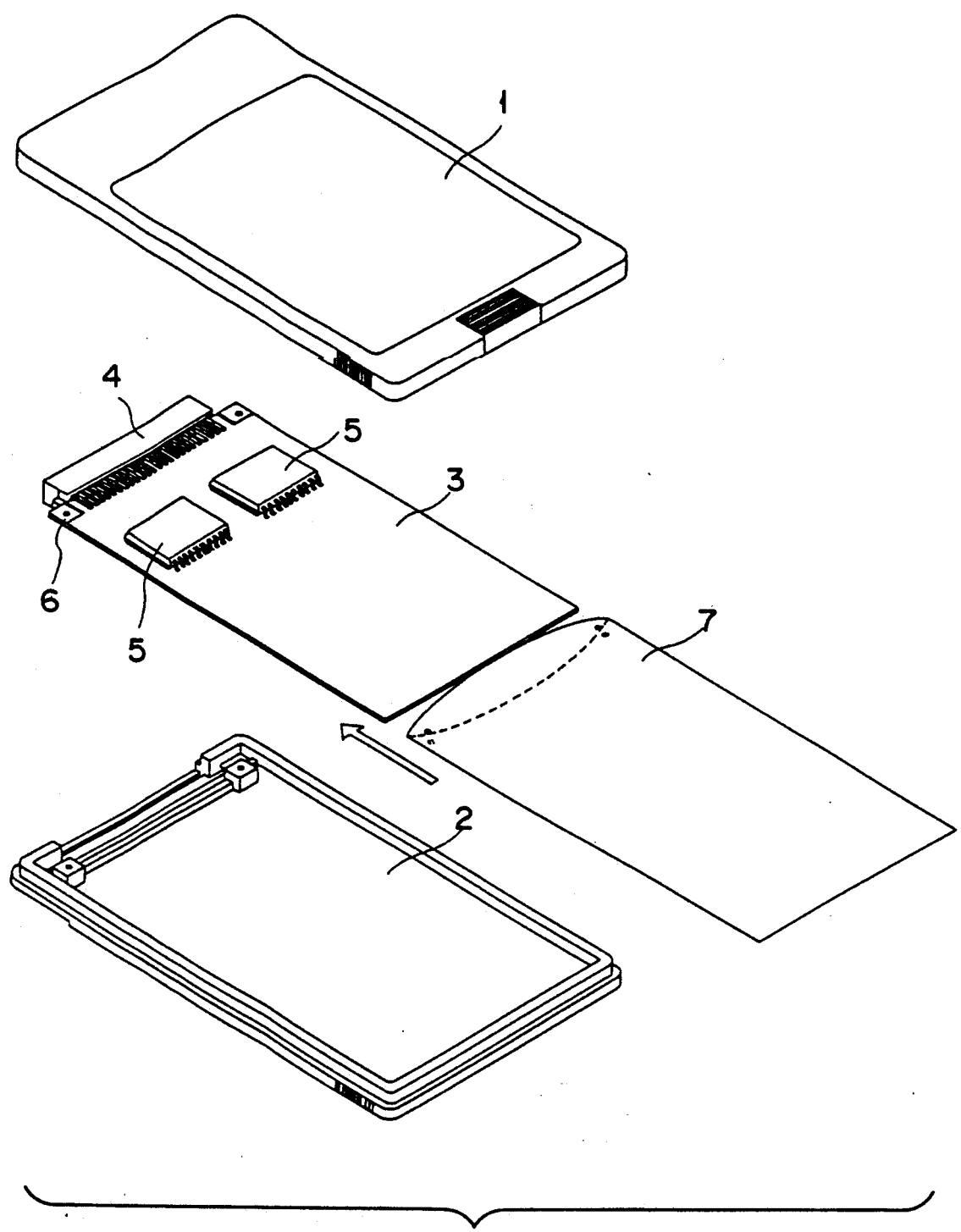
FIG. 1 is an exploded perspective view of a multifunctional card according to an embodiment of the present invention.

An embodiment of the present invention will be described below reference to the accompanying drawings.

As shown in FIGS. 1 and 2 first and second housing halves 1 and 2, which are fitted and constitute upper and lower portions of a housing made of a insulating material, house a substrate 3. The substrate 3 contained within the housing 1, 2 comprises a connector 4, ICs 5, and ground pads 6. A U-shaped metal frame 7 made halves of a conductive material is also arranged in the housing 1 2, so that it positions between the housing and the outer periphery of the substrate 3 so as not be brought into contact with elements and wiring lines on the substrate. Preferably the metal frame 7 is disposed closely to the inside of the mating portion of those halves. Two end portions of the metal frame 7 are connected to the ground pads 6.

A function and effect of the embodiment will be described below. When the static is generated and enters into the multifunctional card through the seam between the first and second housing halves 1 and 2 with the card already extracted from a main apparatus, the static is discharged onto the metal frame 7, and does not reach the substrate in the card. The electrostatic charged in the metal frame is subjected to natural discharge. On the other hand, when the multifunctional card connected to the main apparatus is being pulled out therefrom, the static generated from a human body and the like is discharged onto the metal frame 7. Since the ground portions of the multifunctional card are in contact with the ground terminals of the main apparatus in this state, the static is discharged onto the main apparatus side through the ground pads of the multifunctional card and the ground portions of the main apparatus. Therefore, in this case too, the semiconductor circuits on the substrate are protected from the static. As has been described above, the generated static is discharged through the metal frame 7 to the ground, so that destruction of ICs can be prevented.

The ground pads of the substrate 3 can be constituted by ground terminals of a semiconductor circuit or the like. In addition, the ground pads can be arranged so as to be brought into contact with the ground portions of the main apparatus.

In the embodiment, the metal frame 7 is used. However, instead of the metal frame 7, a wire frame made of a wire can be used, or a length of tape bent into a shape identical to the metal frame 7 can be bonded to the inner surface of one of the housing halves, with its ends connected to the ground portions of the substrate 3.

What is claimed is:

1. A multifunctional integrated circuit card adapted for insertion into and withdrawal from an electrical apparatus, said card comprising:
   a circuit substrate having a plurality of integrated circuit chips mounted thereon,
   a connector mounted along one peripheral edge of said substrate and providing means for electrically connecting the circuit substrate and said integrated circuit chips mounted thereon to an electrical apparatus.
   ground pads disposed on said substrate and electrically connected to said connector.
   a housing of insulative material enclosing said circuit substrate, said housing formed of a top portion and a bottom portion which join together along a peripheral seam adjacent the periphery of said circuit board, and
   a U-shaped conductive member disposed within the joined top and bottom housing portions adjacent said seam, said U-shaped periphery of said circuit substrate except for a portion of said peripheral edge where said connector is mounted, each end of said U-shaped member connected to one of said ground pads.

2. The multifunctional card of claim 1 wherein said U-shaped conductive member is a metal frame.

3. The multifunctional card of claim 1 wherein said U-shaped conductive member is a metal wire.

4. The multifunctional card of claim 1 wherein said U-shaped conductive member is formed of conductive tape bonded to an inner surface of one of said housing portions.

* * * * *

UNITED STATES PATENT AND TRADEMARK OFFICE
CERTIFICATE OF CORRECTION

PATENT NO. : 5,031,076

DATED : July 9, 1991

INVENTOR(S) : Yutaro Kiku

It is certified that error appears in the above-identified patent and that said Letters Patent is hereby corrected as shown below:

Claim 1, column 4, line 5, insert -- conductive member extending adjacent substantially the entire -- after "U-shaped".

Signed and Sealed this

Fifteenth Day of December, 1992

*Attest:*

DOUGLAS B. COMER

*Attesting Officer*     *Acting Commissioner of Patents and Trademarks*

UNITED STATES PATENT AND TRADEMARK OFFICE
CERTIFICATE OF CORRECTION

PATENT NO. : 5,031,076
DATED : July 9, 1991
INVENTOR(S) : Yutaro Kiku

It is certified that error appears in the above-indentified patent and that said Letters Patent is hereby corrected as shown below:

The title page, showing an illustrative figure, should be deleted and substitute therefore the attached title page.

Signed and Sealed this

Twenty-third Day of November, 1993

Attest:

BRUCE LEHMAN

Attesting Officer      Commissioner of Patents and Trademarks

United States Patent [19]
Kiku

[11] Patent Number: 5,031,076
[45] Date of Patent: Jul. 9, 1991

[54] MULTIFUNCTIONAL CARD HAVING A STATIC PROTECTION

[75] Inventor: Yutaro Kiku, Yokohama, Japan

[73] Assignee: E. I. Du Pont de Nemours and Company, Wilmington, Del.

[21] Appl. No.: 446,337

[22] Filed: Dec. 5, 1989

[30] Foreign Application Priority Data

Dec. 6, 1988 [JP] Japan .................... 63-158035[U]

[51] Int. Cl.⁵ .................................. H05K 9/00
[52] U.S. Cl. .................... 361/424; 174/35 R; 361/391; 361/394; 361/397; 361/399
[58] Field of Search .............. 361/212, 220, 395, 216, 361/395, 399, 380, 424, 390, 391, 392, 394, 397; 174/51, 35 R; 364/200, 222, 400; 439/92, 108, 181, 186, 94, 101, 109

[56] References Cited

U.S. PATENT DOCUMENTS

| | | | |
|---|---|---|---|
| 3,603,845 | 9/1971 | Beers | 361/395 |
| 4,300,016 | 11/1981 | Bergeron et al. | 174/35 R |
| 4,667,266 | 5/1987 | Masuoka et al. | 361/212 |
| 4,858,070 | 8/1989 | Buron et al. | 361/395 |
| 4,872,091 | 10/1989 | Mamiwa et al. | 361/424 |

*Primary Examiner*—Leo P. Picard
*Assistant Examiner*—Donald A. Sparks

[57] ABSTRACT

A multifunctional card comprising a substrate having a semiconductor circuit, and a housing, made of an insulating material, for housing the substrate, wherein the housing comprises two pieces of housing halves to be fitted to contain the substrate therein, and a conductive member is arranged in the housing along a seam between the housing halves so as to surround the substrate and to be electrically connected to a ground portion of the substrate.

4 Claims, 2 Drawing Sheets

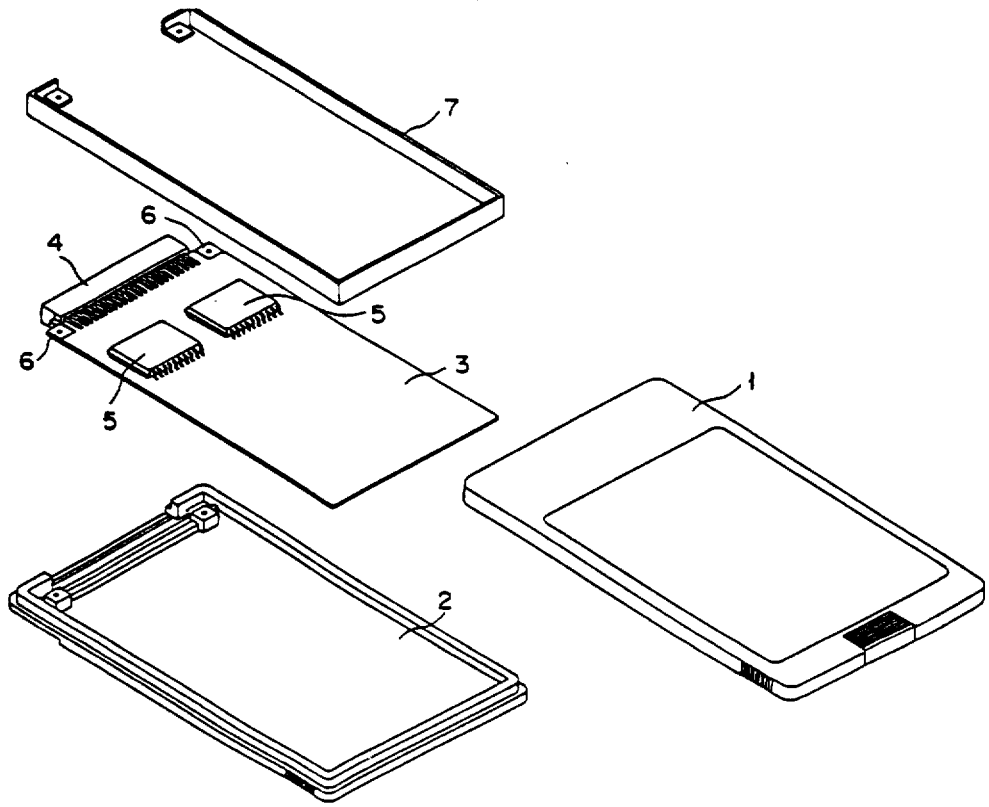

UNITED STATES PATENT AND TRADEMARK OFFICE
CERTIFICATE OF CORRECTION

PATENT NO. : 5,031,076

DATED : July 9, 1991

INVENTOR(S) : Yutaro Kiku

It is certified that error appears in the above-identified patent and that said Letters Patent is hereby corrected as shown below:

In the drawings, Sheet 1, Figure 1 should be deleted and new Figure 1 should appear as follows:

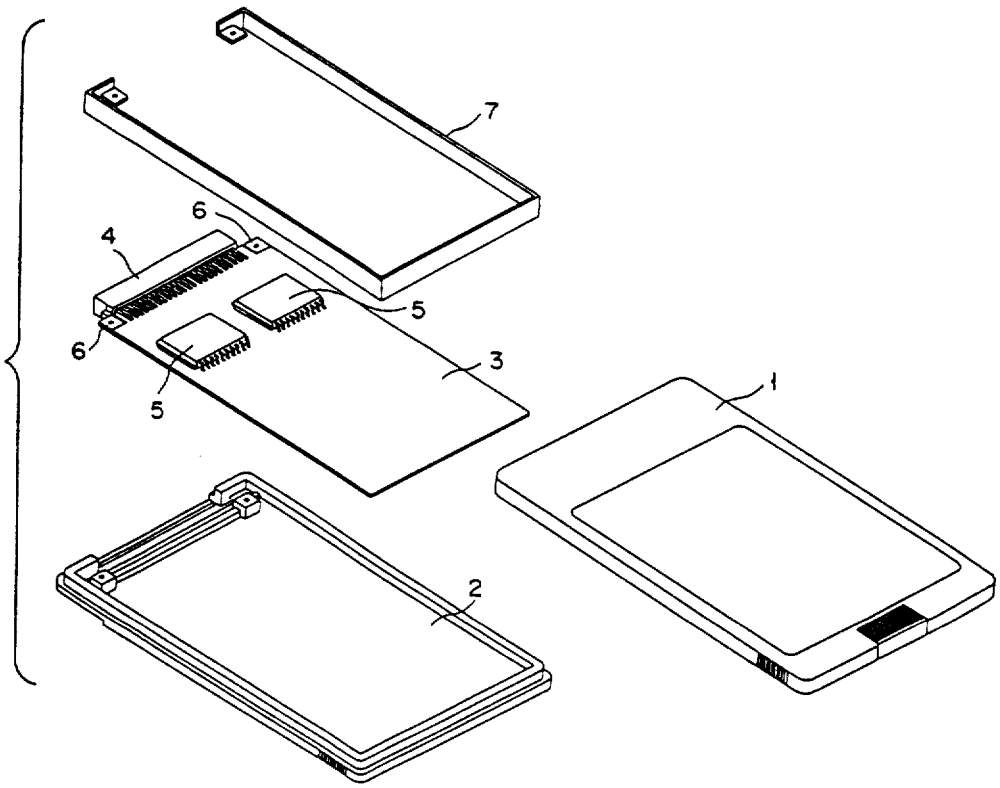

FIG. 1

UNITED STATES PATENT AND TRADEMARK OFFICE
CERTIFICATE OF CORRECTION

PATENT NO. : 5,031,076
DATED : July 9, 1991
INVENTOR(S) : Yutaro Kiku

It is certified that error appears in the above-identified patent and that said Letters Patent is hereby corrected as shown below:

In the drawings, Sheet 2, Figure 2 should be deleted and new Figure 2 should appear as follows:

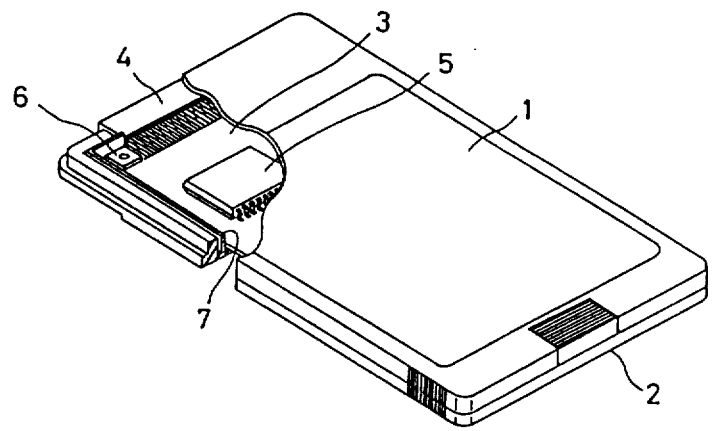

FIG. 2